May 31, 1960 J. G. V. ISABEAU 2,939,040

SCANNING GENERATOR

Filed Aug. 30, 1957 3 Sheets-Sheet 1

Inventor
Jean G. V. Isabeau
By John J. Pederson
Attorney

Inventor
Jean G. V. Isabeau
By John J. Pederson
Attorney

United States Patent Office 2,939,040

Patented May 31, 1960

2,939,040

SCANNING GENERATOR

Jean G. V. Isabeau, Berwyn, Ill., assignor to Zenith Radio Corporation, a corporation of Delaware Filed Aug. 30, 1957, Ser. No. 681,251

13 Claims. (Cl. 315—27)

This invention pertains to a new and improved scanning generator for developing a substantially linear sawtooth current waveform in the cathode-ray tube magnetic deflection yoke normally employed in conventional television receivers and the like.

With the ever increasing availability of and technological improvements in that class of semi-conductor devices known as transistors, considerable effort is being expended in an attempt to find new applications therefor. The low power requirements and relatively small physical size of transistors renders their use in many classes of existing apparatus highly desirable from the point of view of economy of operation and overall physical size. Because of the reduced power requirements, the problem of maintaining appropriately low temperatures within the equipment has been met, thus permitting compactness without danger of component failure.

Due to these advantages, the conventional television receiver has become the focal point of much of this effort, particularly in the light of the rapidly increasing interest in small semi-portable sets. While certain portions of the circuitry customarily used in such receivers is readily altered to permit the substitution of transistors for the usual vacuum tubes, other portions require more than a superficial re-design to make the application of the transistor practical. The scanning circuits, both horizontal and vertical, fall into the latter category primarily because of the substantial energy which must be supplied to replace circuit losses normally incurred when the beam is swept over the phosphor screen of the picture tube. Until recently, transistors were unavailable having adequate maximum allowable collector power dissipation ratings to permit their use for deflection purposes. Currently, however, advances in the processing and packaging of alloy junction types has partially eased this situation; thus, transistors are now available having sufficient collector dissipation ratings to permit their use in scanning circuits.

A transistor vertical scanning generator as applied to television apparatus must be capable of providing a substantially linear saw-tooth current waveform in the magnetic deflection yoke which normally surrounds the neck of the cathode-ray picture tube. While the generator must contain provisions to permit synchronization by the application of vertical synchronization pulses thereto, experience has shown that it is preferable that the generator itself be free running to insure proper operation under weak signal conditions. From the point of view of economy, it is desirable that the generator contain a minimum of components commensurate with the establishment of a sweep current waveform of a quality comparable to that found in present day vacuum tube generators.

Accordingly, it is an object of the present invention to provide a new and improved transistor scanning generator for use in television receivers and the like.

It is a further object of the present invention to provide a transistor scanning generator capable of producing a substantially linear current waveform in a magnetic deflection yoke.

It is a still further object of the present invention to provide a transistor vertical scanning generator which is free running and which contains provisions for external synchronization.

It is another object of the present invention to provide a transistor vertical scanning generator which requires a minimum number of circuit components.

A transistor scanning generator for developing a substantially linear saw-tooth current waveform of predetermined frequency in a cathode-ray tube magnetic deflection yoke, constructed in accordance with the present invention, includes a pair of transistors each having an emitter electrode, a base electrode, and a collector electrode. A series-connected current-translating circuit is formed which includes the emitter-collector electrode conduction path of one of the transistors, the emitter-base electrode conduction path of the other of the pair of transistors, a source of unidirectional potential, and an inductance of a magnitude sufficient to render the series circuit substantially inductive at the predetermined frequency. Means are coupled to the base of the one transistor for alternately providing at the predetermined frequency a reverse bias and a forward bias between the base and emitter electrodes of the one transistor to cause the current in the series circuit to have a substantially saw-tooth waveform which recurs at the predetermined frequency. A load circuit which includes the magnetic deflection yoke is coupled between the collector and emitter electrodes of the other transistor thereby utilizing the linear portion of the base-to-collector electrode current transfer characteristic of the other transistor to establish an amplified current in the magnetic deflection yoke which has substantially the same linear saw-tooth waveform as the current in the series circuit.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

In order to better understand the design considerations and operation of a transistor vertical scanning generator constructed in accordance with the present invention, certain concepts should be considered. As is well known, the electron beam in a conventional cathode-ray picture tube is swept linearly across the face of the tube in a repetitive manner. The vertical and horizontal scanning rates have been established in this country at 60 and 15,750 completed scans per second, respectively. This basic difference in scanning rate is one of the major factors which must be considered in the design of practical vertical and horizontal scanning circuits. At the slower or 60 cycle per second vertical rate, the conventional deflection coils appear substantially resistive while at the 15,750 horizontal scanning rate an equivalent deflection coil acts substantially inductive. As a result, the vertical deflection coils can be treated as a resistive element and, when used as the load for an active circuit element such as a transistor, do not materially affect the waveform of the required input drive signal. It should, however, be realized that the inductive component of the vertical deflection coils must be taken into account during the retrace or fly-back portion of the sweep cycle since the voltage spike which appears across the coils during this interval is in series aiding relation to the circuit voltage source and hence is instrumental in determining the required voltage rating of the active element.

Experience has shown that the vertical deflection coils may be directly connected to the collector of a conventional power transistor without an intervening impedance matching transformer or the like. When the base-emitter circuit is driven by an appropriately shaped saw-tooth current waveform, the current through the vertical deflection coils has substantially the same waveform with little discernible deviation attributable to inductive effect.

Figure 1:
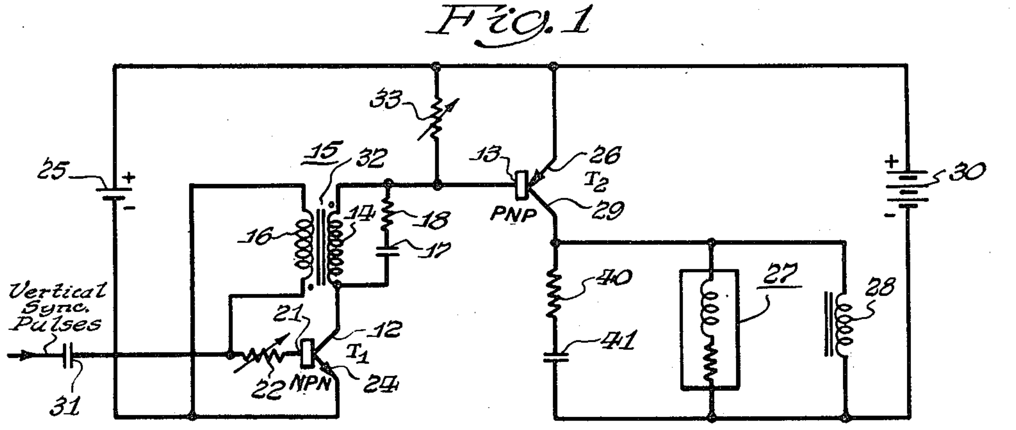
Figure 1 is a schematic diagram of a transistor vertical scanning generator constructed in accordance with one embodiment of the present invention.

Turning now to the construction of the arrangement of Figure 1, a pair of triode transistors $T_1$ and $T_2$, which are of the NPN and PNP types respectively, serve as the active circuit elements. For reasons to be explained, transistor $T_1$ may be called the switching transistor and transistor $T_2$ may be called the current-amplifying transistor. The collector electrode 29 of transistor $T_2$ is connected to one terminal of a vertical magnetic deflection yoke 27 which is shunted by a direct current by-pass inductor 28. As shown, yoke 27 contains both resistance and inductance. The other terminal of yoke 27 is connected to the negative terminal of a unidirectional potential source such as a battery 30 of appropriate voltage rating. The emitter electrode 26 of transistor $T_2$ is connected to the positive terminal of potential source 30 thereby completing the emitter-collector circuit of transistor $T_2$. Yoke 27 is further shunted with the series combination of a capacitor 41 and a damping resistor 40.

The base electrode 13 of transistor $T_2$ is connected to the collector electrode 12 of transistor $T_1$ through an inductor 14 which is shunted by the series circuit consisting of a resistor 18 and a condenser 17. As is shown, inductor 14 may be the primary winding of a pulse transformer 15. Emitter electrode 24 of transistor $T_1$ is connected to the negative terminal of a second unidirectional potential source 25, the positive terminal of which is returned to the junction of emitter 26 and source 30. Consequently, a series circuit is formed which includes the emitter-base conduction path of transistor $T_2$, inductor 14, the collector-emitter conduction path of $T_1$, and source 25.

A second inductor 16, which may be the secondary winding of pulse transformer 15, is inductively coupled to inductor 14 through the medium of a common magnetic core 32. One terminal of coil 16 is connected to the base electrode 21 of transistor $T_1$ through a variable base resistor 22 and the other terminal is directly connected to emitter electrode 24 of transistor $T_1$. A coupling capacitor 31 is connected to the junction of coil 16 and resistor 22 to permit the introduction of external vertical synchronizing pulses to base electrode 21. A variable resistor 33, connected between emitter 26 and base 13 of transistor $T_2$, may be provided for reasons which will be explained later. It should be clear that while source 25 is shown as being separate and distinct from source 30, it may be eliminated by connecting the junction of coil 16 and emitter 24 to an appropriate tap on source 30.

Figure 2:
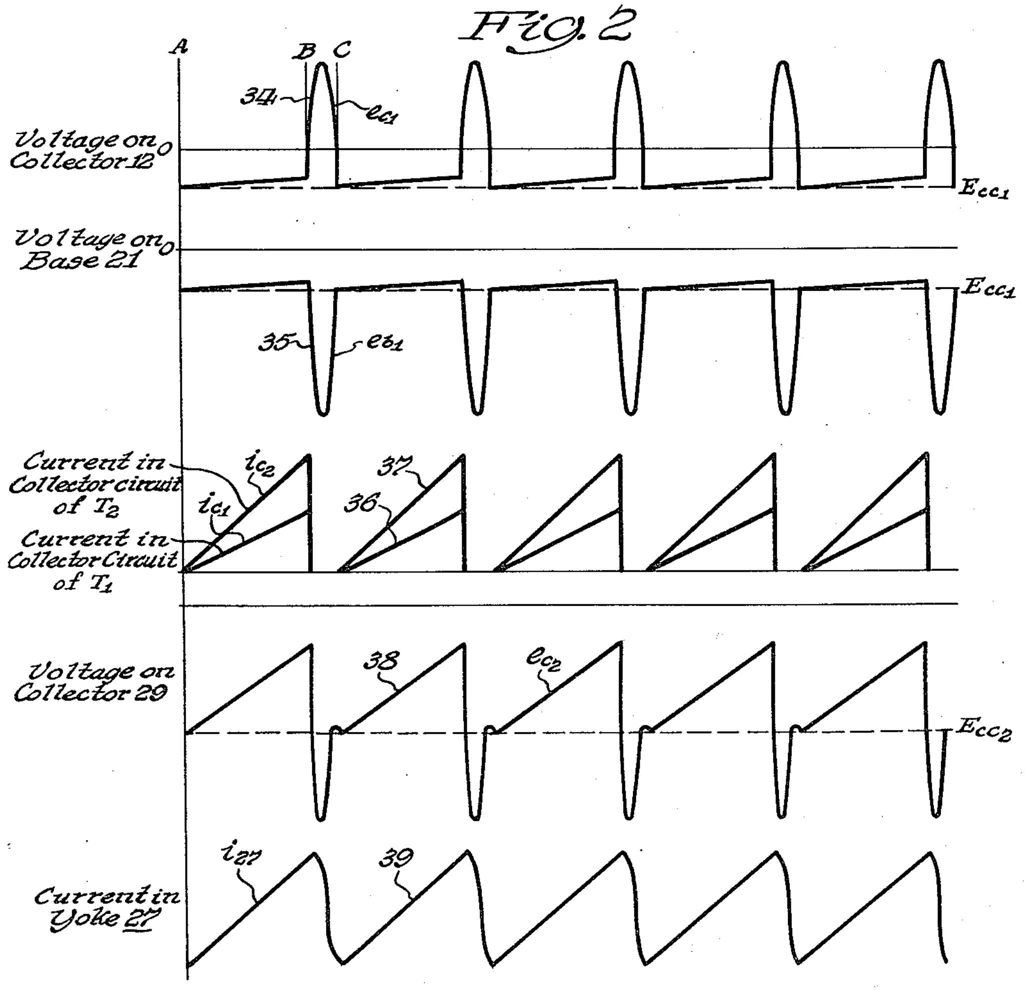
Figure 2 is a graphical representation of certain voltage and current waveforms which appear at various points in the circuit of Figure 1.

An explanation of the operation of the circuit of Figure 1 is best accomplished with the aid of the graphical representation of certain voltage and current waveforms as shown in Figure 2. Curves 34 and 35 are representations of the voltage waveforms $e_{c_1}$ and $e_{b_1}$ which appear on collector electrode 12 and base electrode 21 of transistor $T_1$, respectively, during normal operation of the circuit. Curves 36 and 37 represent the current waveforms $i_{c_1}$ and $i_{c_2}$ which appear in the collector circuits of $T_1$ and $T_2$, respectively. Curve 38 represents the voltage waveform appearing on collector electrode 29 of $T_2$ and curve 39 shows the actual current $i_{27}$ in yoke 27.

Curve 36 shows that the composite waveform of the current $i_{c_1}$ appearing in the collector circuit of transistor $T_1$ has a repetitive period A—C which comprises two shorter intervals A—B and B—C. Interval A—B occupies a substantial portion of the period and represents the time in which a linearly increasing current flows. During interval B—C, the current decreases rapidly to its initial starting value and remains at this value until the start of the next period. Accordingly, interval A—B represents a linear sweep portion of the composite waveform while interval B—C represents the fly-back portion. The manner in which each of these intervals is produced by the circuit of Figure 1 will now be described.

Figure 7:
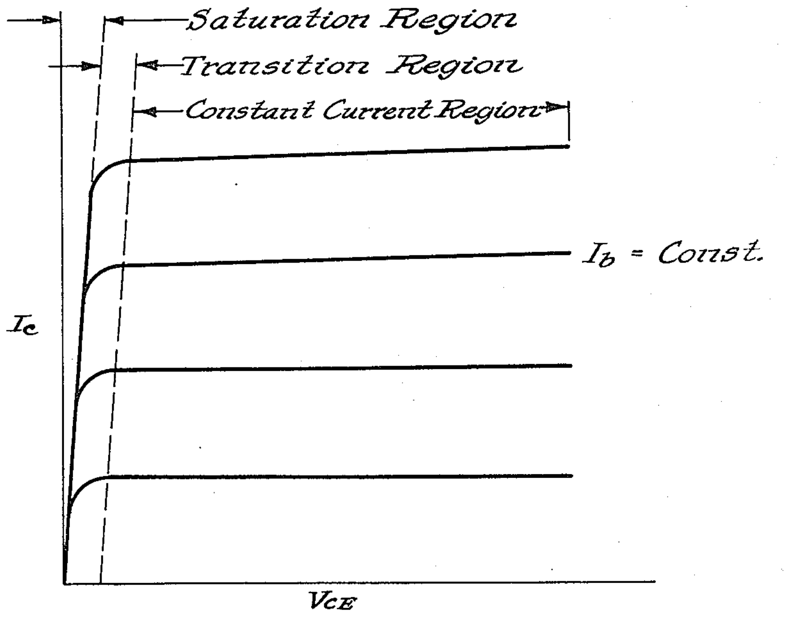
Figure 7 is a graphical representation of the collector characteristics of a transistor in the common emitter connection.

Operation of the circuit is most easily described and understood by proceeding through each of the two aforementioned intervals sequentially, starting at instant A. At time A, a small increasing current is caused to flow in the collector circuit of transistor $T_1$ by means which will be better understood at a later point in the explanation. The presence of this small increasing current in inductor 14 serves to induce a voltage in inductor 16 through the medium of inductive coupling. Inductors 14 and 16 are poled in a manner such that this induced voltage is of proper polarity to forward bias the base-emitter junction of switching transistor $T_1$. The presence of base current in transistor $T_1$ in combination with the low collector voltage which results from the large initial voltage drop across inductor 14 establishes the operation of transistor $T_1$ in the saturation mode. Reference to Figure 7, which represents a family of typical collector characteristics for common emitter operation of a transistor, indicates that the collector-to-emitter impedance of transistor $T_1$, while operating in this mode, is very low. Since the emitter-base junction of transistor $T_2$ introduces no appreciable resistance, the subsequent current build-up in the series circuit comprising the emitter-base junction of transistor $T_2$, inductor 14, the emitter-collector conduction path of transistor $T_1$, and potential source 25 is influenced solely by the presence of inductance 14. As is well known, the current rise in such a circuit, under the influence of a constant driving voltage such as that from source 25, is substantially linear.

During the linear current rise through inductor 14, the voltage induced in inductor 16 is, by virtue of the constant time rate of change of flux linkages, constant in magnitude thereby providing a base current in transistor $T_1$ which is also substantially constant and of a magnitude determined by the size of base resistor 22. This level of base current determines upon which of the family of collector characteristics the operation of transistor $T_1$ falls. After passage of a discrete time represented by interval A—B, the collector current of transistor $T_1$ reaches the knee of the particular characteristic curve upon which transistor $T_1$ is operating and enters the transition zone between the saturation and constant current modes of operation. In this region, the current rise is no longer linear and the rate tends to decrease. This has the effect of reducing the voltage induced in inductor 16 with a corresponding decrease in the base current of transistor $T_1$. This resultant feedback through transformer 15 causes a rapid regenerative action to occur at the beginning of the interval B—C. As is shown in curve 35, the energy stored in transformer 15 causes the network comprising coil 14, resistor 18 and condenser 17 to ring for approximately one-half cycle of its natural resonant frequency. Resistor 18 and condenser 17 thus serve to dissipate during each fly-back interval the energy stored in inductance 14 during the immediately preceding sweep interval. This causes the potential of base 21 to be rapidly depressed below the potential of emitter 24 causing the collector current to decay rapidly to its initial starting value. This rapid current decay, which occurs during interval B—C, represents the fly-back portion of the composite waveform. Upon completion of the aforementioned decayed oscillation of coil 14, the potential of base electrode 21 of transistor $T_1$ rises slightly above the potential of emitter 24 and collector current once again commences to flow resulting in the generation of the next sweep.

Passage of the collector current of switching transistor $T_1$ through the base-emitter junction of current-amplifying transistor $T_2$ serves to provide an amplified collector current in yoke 27 having substantially the same waveform as the collector current of transistor $T_1$. This results from the substantially linear base-to-collector electrode current transfer characteristic and the current gain inherent in the common-emitter mode of operation. Direct-current bypass inductor 28 is provided to bypass a major portion of the average collector current of transistor $T_2$ around yoke 27 thereby eliminating certain beam centering problems. This inductor is chosen to have a D.C. resistance substantially lower than that of yoke 27 while presenting a substantially higher impedance than yoke 27 to the sweep components of the collector current of transistor $T_2$. It should be evident that inductor 28 may be eliminated if other means is provided to accomplish centering of the sweep.

The damping network comprising the series combination of capacitor 41 and damping resistor 40 serves to dissipate the energy stored in yoke 27 during the sweep. By choosing damping resistor 40 of proper size substantially all of the stored energy is dissipated during the fly-back interval resulting in the yoke current waveform represented by curve 39.

The sweep frequency of the circuit can be changed by varying the size of adjustable base resistor 22. As has been previously stated, the size of this resistor determines the magnitude of base current in transistor $T_1$ during interval A—B and hence serves to select a particular one of the family of collector characteristics upon which transistor $T_1$ operates. Decreasing the ohmic impedance of base resistor 22 permits a larger base current to flow, causing transistor $T_1$ to remain in the saturation mode to a higher level of collector current. Since the rate of increase of collector current is substantially determined by the size of inductor 14 and the magnitude of potential source 25, this change in base current causes interval A—B to be lengthened time-wise resulting in reduced frequency of operation. Increasing the magnitude of base resistor 22 will, of course, have the opposite effect.

It should be noted that changing the frequency of operation in this manner also has the effect of varying the amplitude of the resultant sweep. It may be desirable to include a variable resistor 33 to permit readjustment of the sweep amplitude independent of the operating frequency. By bridging variable resistor 33 across the base-emitter electrodes of transistor $T_2$, a portion of the collector current of transistor $T_1$ is shunted around the emitter-base junction of transistor $T_2$. This has the effect of varying the drive on current-amplifying transistor $T_2$ permitting adjustment of the sweep amplitude to any desired value. Variation of the magnitude of voltage source 25 also results in a change in the amplitude of the sweep. The compensating effects of such a variation on the collector and emitter circuits of transistor $T_1$ renders the sweep frequency substantially independent of the sweep amplitude variations. An increase in the magnitude of source 25 tends to increase the time rate of current change in the collector circuit of transistor $T_1$ but this effect is substantially offset by the tendency toward a greater induced voltage in inductor 16 and a correspondingly higher base current in transistor $T_1$. This, in effect, shifts the operation of transistor $T_1$ to a new collector characteristic curve having its knee at a higher level of collector current. This results in a change in the slope of curve 36 during interval A—B without an appreciable change in the overall period A—C. Decreasing the magnitude of source 25 has the opposite effect tending to decrease the slope of curve 36 during the sweep interval with substantially no variation in the frequency of operation.

The length of fly-back interval B—C is determined by the natural resonant frequency of the network comprising coil 14, resistor 18 and condenser 17. Conventionally, this interval is made substantially shorter than sweep interval A—B to provide a rapid retrace of the beam from its position at the terminal end of the sweep to its initial starting position. The length of this interval may be varied by varying the size of capacitor 17; increasing the size of this capacitor decreases the natural resonant frequency of the network which provides a corresponding lengthening of the interval. A decrease in the size of capacitor 17 will, of course, have the opposite effect. The minimum allowable length of flyback interval B—C is substantially determined by the time required to dissipate the energy stored in pulse transformer 15 at the terminal end of the sweep. While it is desirable that retrace time be kept small relative to sweep time, it is also desirable that the voltage peak which appears on the collector electrode of transistor $T_1$ during the retrace interval be kept as small as possible to permit the use of readily available transistors without the danger of exceeding their maximum allowable collector voltage rating. By maintaining fly-back interval B—C of maximum length commensurate with acceptable fly-back time under current television standards, the $T_1$ collector voltage peak, as shown in curve 34 of Figure 2, is held to an acceptable minimum.

Curve 38 of Figure 2 shows the composite voltage waveform which appears on collector 29 of transistor $T_2$ when interval B—C has been adjusted very nearly to its maximum allowable value. A further increase in the length of the interval would result in distortion of the initial portion of the sweep. Resistor 18 is chosen of a magnitude to provide slightly under-critical damping of coil 14 to preclude the generation of substantially more than the afore-described half cycle. Such damping insures a timely start of the collector current of transistor $T_1$ without the delay which would occur in the case of over damping or the oscillatory component which would result from under damping, both of which would tend to introduce distortion in the initial portion of the sweep. It should be noted that the series combination of capacitor 17 and damping resistor 18 may be placed across inductor 16 with equally satisfactory results.

Coupling capacitor 31 is provided to permit the introduction of external synchronizing pulses to the base of transistor $T_1$. As is customary in conventional television receivers, vertical and horizontal synchronizing information is included in the composite transmitted television signal. This information is conventionally separated from the remainder of the signal by a sync separator circuit which supplies the appropriate synchronizing pulses to the horizontal and vertical sweep circuits. Negative going vertical synchronzing pulses, derived from such a circuit, may be applied to the circuit of Figure 1 to provide synchronized operation.

Figure 3:
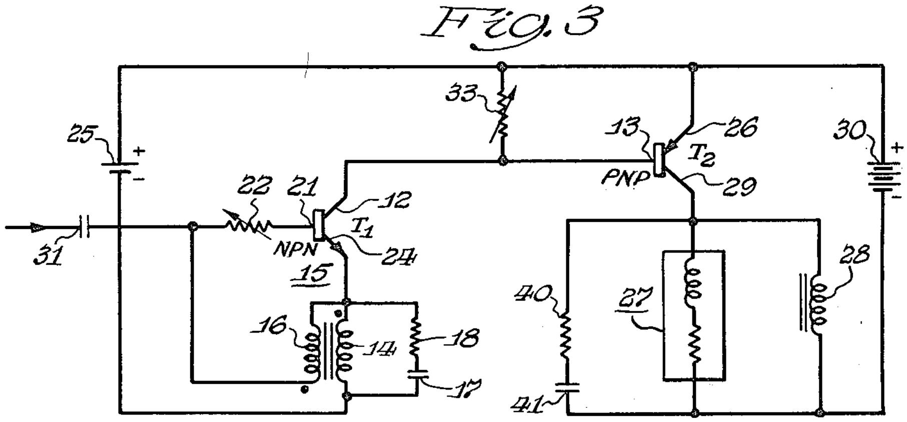
Figures 3, 4, 5 and 6 are schematic diagrams of modifications of the circuit of Figure 1 illustrating different embodiments of the invention.

The alternate embodiments shown in Figures 3, 4, 5 and 6 are, in many respects, identical with that of Figure 1. In Figure 3, inductor 14 is connected between the emitter electrode 24 of transistor $T_1$ and the negative terminal of voltage source 25. Coil 16 is connected between emitter 24 and the junction of resistor 22 and condenser 31. The remainder of the circuit is substantially the same as that of Figure 1, and its operation is identical with that of Figure 1 in all respects.

Figure 4:
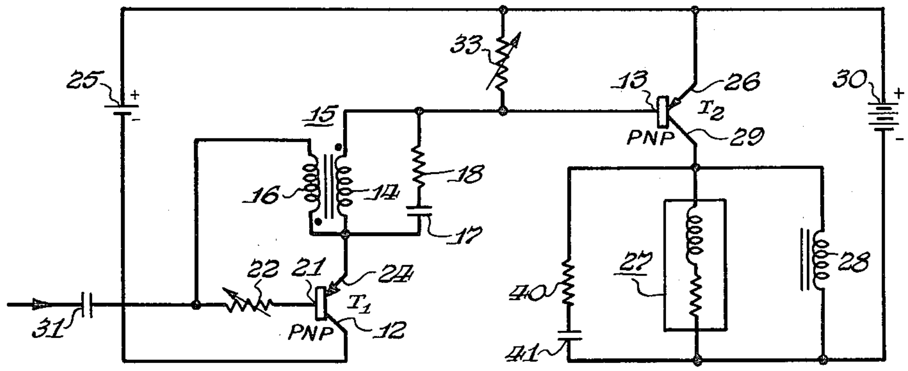

In Figure 4, transistor $T_1$ of the circuit of Figure 1 has been replaced with a transistor of the PNP type. Inductor 16 is connected between emitter 24 and the junction of resistor 22 and condenser 31, and the remaining emitter and collector connections of transistor $T_1$ are reversed. Once again the operation of this circuit is identical with that shown in Figure 1 with the exception that positive-going synchronizing pulses must be used in place of the negative-going pulses previously described in connection with Figure 1.

Figure 5:
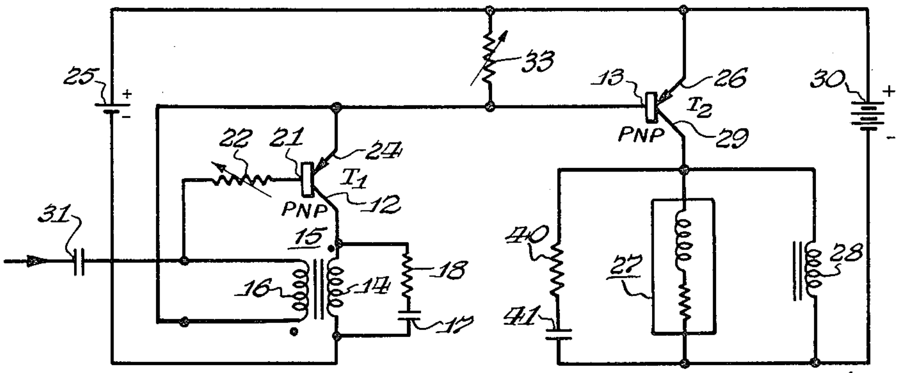

In Figure 5, emitter 24 of PNP transistor $T_1$ is directly connected to base 13 of transistor $T_2$ and coil 16 is connected between the junction of emitter electrode 24 and base electrode 13 and the junction of condenser 31 and resistor 22. Coil 14 is connected between collector 12 and the negative terminal of source 25. Again the operation of this circuit is identical with that of Figure 1 with the exception that positive-going synchronizing pulses must be provided.

From this, it is clear that the embodiments shown in Figures 3, 4 and 5 merely introduce alternative constructions which may utilize NPN or PNP type transistors for transistor $T_1$ and in which inductors 14 and 16 are introduced in various ways to bring about the same result. Operationally these circuits are all equivalent with the possible exception that the utilization of a PNP type transistor for $T_1$, in place of the NPN type used in Figure 1, necessitates the use of positive rather than negative going synchronizing pulses. All of the embodiments may also be externally synchronized by applying synchronizing pulses of appropriate polarity to the collector electrode of $T_1$. The circuits are less sensitive to synchronization by this method however; hence a synchronizating signal of greater amplitude is required.

In the embodiments described thus far, switching transistor $T_1$ is alternately subjected to a forward and reverse bias by means of a feedback signal from coil 16, the transistor thereby assuming conductive and non-conductive states in alternation. When in its conductive state, transistor $T_1$ effectively applies a constant voltage to inductance 14, thereby creating a saw tooth shaped current in that inductance. Current-amplifying transistor $T_2$ amplifies this current of saw-tooth waveshape and produces a replica thereof in magnetic deflection yoke 27. Since transistor $T_1$ merely serves as a switching device operated at a rate corresponding to the sweep frequency, coil 16 may be omitted and the switching signal derived from yoke 27.

Figure 6:
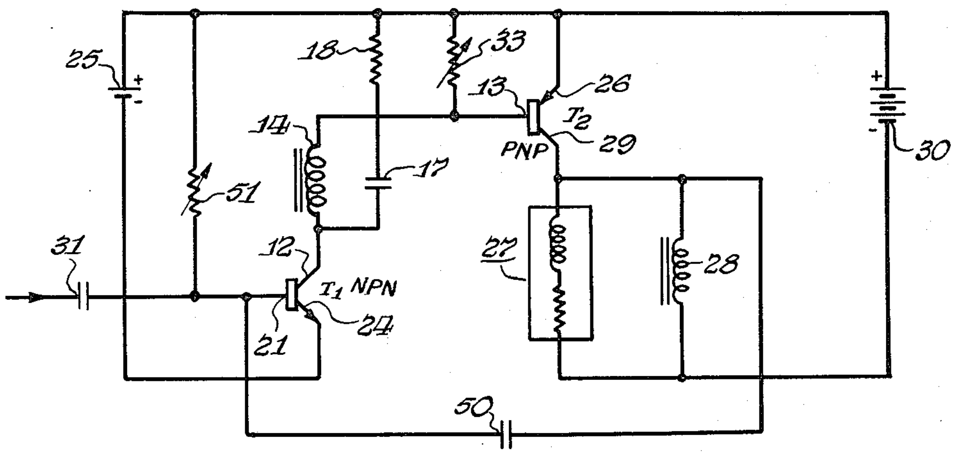

Figure 6 discloses such a variation of the Figure 1 arrangement in that coil 16 is eliminated and a feedback circuit comprising a coupling condenser 50 is connected from the junction of yoke 27 and collector 29 of transistor $T_2$ to base 21 of transistor $T_1$. The feedback signal derived from yoke 27 is of the proper polarity to effectively switch transistor $T_1$ between its conductive and non-conductive states. Base 21 is also connected to the positive terminal of source 25 through a variable resistor 51. The average base current for transistor $T_1$ flows through resistor 51 and by varying the resistance thereof, the free-running frequency of the entire circuit may be changed.

It will also be noted in the Figure 6 embodiment that instead of connecting the series combination of condenser 17 and damping resistor 18 across coil 14, as in the case of Figure 1, these components are connected between the junction of coil 14 and collector 12 of transistor $T_1$ to emitter 26 of transistor $T_2$. With this arrangement, the current, by which the stored energy in inductor 14 is removed and partially dissipated in resistor 18, flows in the base-emitter junction of transistor $T_2$. Transistor $T_2$ is thus never cut off, and since its collector current is proportional to the current flowing through inductor 14 at all times, including the damping or fly-back interval, no other damping is necessary across yoke 27. Therefore, condenser 41 and resistor 40 have been omitted in Figure 6.

By way of summary, the present invention provides a scanning generator for developing a substantially linear saw-tooth current waveform of predetermined frequency in cathode-ray tube magnetic deflection yoke 27. The generator comprises a pair of transistors $T_1$ and $T_2$ each having an emitter electrode, a base electrode, and a collector electrode. A series-connected current-translating circuit includes the emitter-collector electrode conduction path of transistor $T_1$, the emitter-base conduction path of transistor $T_2$, source 25 of unidirectional potential, and inductance 14 which is of a magnitude sufficient to render the series circuit substantially inductive at the predetermined frequency. Means (coil 16 in the embodiments of Figures 1, 3–5 and condenser 50 in Figure 6) are coupled to base 21 of transistor $T_1$ for alternately providing at the predetermined frequency a reverse bias and a forward bias between base 21 and emitter 24 of $T_1$ to cause the current in the series circuit to have a substantially sawtooth waveform recurrent at the predetermined frequency. A load circuit including magnetic deflection yoke 27 is provided between collector 29 and emitter 26 of transistor $T_2$ thereby utilizing the linear portion of the base-to-collector electrode current transfer characteristic of transistor $T_2$ to establish an amplified current in yoke 27 of substantially the same sawtooth waveform.

The present invention, therefore, provides a transistor scanning generator which may be employed in a conventional television receiver. It incorporates transistors in place of the more conventional vacuum tubes and provides sweep linearity and stability fully commensurate with presently accepted standards. Power requirements are substantially below those of more conventional present-day circuitry and the number of components required is at a minimum. The generator is free running with provisions for external synchronization.

While particular embodiments of the invention have been shown and described, modifications may be made, and it is intended in the appended claims to cover all such modifications as may fall within the true spirit and scope of the invention.

I claim:

1. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; means coupled to the base of said one transistor for alternately providing at said predetermined frequency a reverse bias and a forward bias between the base and emitter electrodes of said one transistor to cause the current in said series circuit to have a substantially saw-tooth waveform recurrent at said predetermined frequency; and a load circuit including said magnetic deflection yoke coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform.

2. A scanning generator for developing a substantially linear saw-tooth current waveform of predetermined frequency in a cathode-ray tube magnetic deflection yoke comprising: a switching transistor having an emitter electrode, a base electrode, and a collector electrode and responsive to the forward biasing between said base and emitter electrodes for assuming a conductive state wherein a relatively low-impedance path is provided between said emitter and collector electrodes to permit current translation therebetween and responsive to the reverse biasing between said base and emitter electrodes for assuming a non-conductive state wherein a relatively high-impedance path is provided between said emitter and collector electrodes to prevent the translation of current therebetween; a current-amplifying transistor having an emitter electrode, a base electrode, and a collector electrode; a series-connected current-translating circuit including the emitter-collector electrode conduction path of said switching transistor, the emitter-base electrode conduction path of said current-amplifying transistor, a source of unidirectional potential, and an inductance of a magnitude sufficient to render said series circuit substantially inductive at said predetermined frequency; means coupled to the base of said switching transistor for effecting alternate forward and reverse biasing thereof at said predetermined frequency to actuate said switching transistor between its conductive and non-conductive states to cause the current in said series circuit to have a substantially saw-tooth waveform recurrent at said predetermined frequency; and a load circuit including said magnetic deflection yoke coupled between the collector and emitter electrodes of said current-amplifying transistor thereby utilizing the linear portion of the base-to-collector electrode current transfer characteristic of said amplifying transistor to establish an amplified current in said magnetic deflection yoke of substantially the same saw-tooth waveform.

3. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; means coupled to the base of said one transistor for alternately providing at said predetermined frequency a reverse bias and a forward bias between the base and emitter electrodes of said one transistor to cause the current in said series circuit to have a substantially saw-tooth waveform recurrent at said predetermined frequency; and a load circuit including a source of unidirectional potential and said magnetic deflection yoke coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform.

4. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; means coupled to the base of said one transistor for alternately providing at said predetermined frequency a reverse bias and a forward bias between the base and emitter electrodes of said one transistor to cause the current in said series circuit to have a substantially saw-tooth waveform having spaced sweep intervals recurrent at said predetermined frequency with intervening fly-back intervals, said inductance storing energy during the sweep intervals; a load circuit including said magnetic deflection yoke coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform; and dampening means coupled to said inductance for dissipating during each fly-back interval the energy stored during the immediately preceding sweep interval.

5. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; means coupled to the base of said one transistor for alternately providing at said predetermined frequency a reverse bias and a forward bias between the base and emitter electrodes of said one transistor to cause the current in said series circuit to have a substantially saw-tooth waveform having spaced sweep intervals recurrent at said predetermined frequency with intervening fly-back intervals; a load circuit including said magnetic deflection yoke coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform, said yoke storing energy during the sweep intervals; and damping means coupled to said magnetic deflection yoke for dissipating during each fly-back interval the energy stored during the immediately preceding sweep interval.

6. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; a load circuit including said magnetic deflection yoke coupled between the collector and emitter electrodes of said other transistor; feedback means coupled between said yoke and the base of said one transistor for alternately providing at said predetermined frequency a reverse bias and a forward bias between the base and emitter electrodes of said one transistor to cause the current in said series circuit to have a substantially saw-tooth waveform recurrent at said predetermined frequency, said other transistor establishing an amplified current in said magnetic deflection yoke of substantially the same saw-tooth waveform.

7. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including in the order named the emitter-collector electrode conduction path of one of said pair of transistors, an inductance of a magnitude sufficient to render said series circuit substantially inductive at said predetermined frequency, the emitter-base electrode conduction path of the other of said pair of said transistors, and a source of unidirectional potential; means coupled to the base of said one transistor for alternately providing at said predetermined frequency a reverse bias and a forward bias between the base and emitter electrodes of said one transistor to cause the current in said series circuit to have a substantially saw-tooth waveform having spaced sweep intervals recurrent at said predetermined frequency with intervening fly-back intervals, said inductance storing energy during the sweep intervals; a load circuit including in the order named a series combination of said magnetic deflection yoke, another source of unidirectional potential, and the emitter-collector electrode conduction path of said other transistor for establishing an amplified current in said magnetic deflection yoke of substantially the same saw-tooth waveform, said yoke storing energy during the sweep intervals; and a damping circuit connected from the junction of said inductance and the collector the said one transistor to the emitter of said other transistor for dissipating during each fly-back interval the energy stored in said inductance and said yoke during the immediately preceding sweep interval.

8. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; feedback means, including a resonant network having a period substantially shorter than the period of said predetermined frequency, coupled between the base and emitter electrodes of said one transistor for providing a reverse bias between such base and emitter electrodes for a portion of the period of said predetermined frequency substantially equal to one-half the period of said resonant network and a forward bias for the remainder of the period of said predetermined frequency to cause the current in said series circuit to have a substantially saw-tooth waveform recurrent at said predetermined frequency; and a load circuit, substantially resistive at said predetermined frequency and including said magnetic deflection yoke, coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform.

9. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; a resistance element having one end connected to the base electrode of said one transistor; a resonant network including said inductance having a period substantially shorter than the period of said predetermined frequency; another inductance connected between the emitter of said one transistor and the end of said resistance element remote from the base electrode of said one transistor for providing a reverse bias between the base and emitter electrodes of said one transistor for a portion of the period of said predetermined frequency substantially equal to one-half the period of said resonant network and a forward bias for the remainder of the period of said predetermined frequency to cause the current in said series circuit to have a substantially saw-tooth waveform recurrent at said predetermined frequency; and a load circuit, substantially resistive at said predetermined frequency and including said magnetic deflection yoke, coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform.

10. A scanning generator for developing a substantially linear saw-tooth current waveform of predetermined frequency in a cathode-ray tube magnetic deflection yoke comprising: a pair of transistors each having an emitter electrode, a base electrode, and a collector electrode; a series-connected current-translating circuit including the emitter-collector electrode conduction path of one of said pair of transistors, the emitter-base electrode conduction path of the other of said pair of transistors, a direct connection therebetween, and an inductance connected to the terminal of said emitter-collector electrode conduction path remote from said emitter-base electrode conduction path and of a magnitude sufficient to render said series circuit substantially inductive at said predetermined frequency; feedback means, including a resonant network having a period substantially shorter than the period of said predetermined frequency, coupled between the base and emitter electrodes of said one transistor for providing a reverse bias between such base and emitter electrodes for a portion of the period of said predetermined frequency substantially equal to one-half the period of said resonant network and a forward bias for the remainder of the period of said predetermined frequency to cause the current in said series circuit to have a substantially saw-tooth waveform recurrent at said predetermined frequency; and a load circuit, substantially resistive at said predetermined frequency and including said magnetic deflection yoke, coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform.

11. A scanning generator for developing a substantially linear saw-tooth current waveform of predetermined frequency in a cathode-ray tube magnetic deflection yoke comprising: a pair of transistors each having an emitter electrode, a base electrode and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; means coupled to the base of said one transistor for alternately providing at said predetermined frequency a reverse bias and a forward bias between the base and emitter electrodes of said one transistor to cause the current in said series circuit to have a substantially saw-tooth waveform having spaced sweep intervals recurrent at said predetermined frequency with intervening fly-back intervals, said inductance storing energy during the sweep intervals; a load circuit including said magnetic deflection yoke coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform, said yoke storing energy during the sweep intervals; and a damping circuit including the base-emitter electrode conduction path of said other transistor coupled across said inductance for dissipating during each fly-back interval the energy stored in said inductance and said yoke during the immediately preceding sweep interval.

12. A scanning generator in accordance with claim 11 wherein said damping circuit includes a resistor and a condenser connected in series with the base-emitter electrode conduction path of said other transistor.

13. A scanning generator for developing a substantially linear saw-tooth current waveform of predetermined frequency in a cathode-ray tube magnetic deflection yoke comprising: a pair of transistors each having an emitter electrode, a base electrode and a collector electrode; a series-connected current-translating circuit including the emitter-collector electrode conduction path of one of said pair of transistors, the emitter-base electrode conduction path of the other of said pair of transistors, a source of unidirectional potential, and an inductance of a magnitude sufficient to render said series circuit substantially inductive at said predetermined frequency; means coupled to the base of said one transistor for alternately providing at said predetermined frequency a reverse bias and a forward bias between the base and emitter electrodes of said one transistor to cause the current in said series circuit to have a substantially saw-tooth waveform recurrent at said predetermined frequency; a load circuit including said magnetic deflection yoke coupled between the collector and emitter electrodes of said other transistor thereby utilizing the linear portion of the base-to-collector electrode current transfer characteristic of said other transistor to establish an amplified current in said magnetic deflection yoke of substantially the same saw-tooth waveform; and means for applying external synchronizing pulses to the base of said one transistor.

References Cited in the file of this patent

UNITED STATES PATENTS

| | | |
|---|---|---|
| 2,556,286 | Meacham | June 12, 1951 |
| 2,811,643 | Eberhard | Oct. 29, 1957 |
| 2,814,736 | Hamilton | Nov. 26, 1957 |

FOREIGN PATENTS

| | | |
|---|---|---|
| 737,249 | Great Britain | Sept. 21, 1955 |

OTHER REFERENCES

Proceedings of the IRE, "A Study of Transistor Circuits for Television," by Sziklai et al., pp. 708–713, June 1953.

Radio & Television News, "A Transistorized Audio Oscillator," by L. E. Garner, pp. 68–69, September 1953.

Wireless Engineer, "Junction-Transistor Trigger Circuits," by J. E. Flood, pp. 122–130, May 1955.